(12) United States Patent
Niimura et al.

(10) Patent No.: US 7,819,973 B2
(45) Date of Patent: Oct. 26, 2010

(54) APPARATUS FOR CRYSTAL GROWTH OF BIOMACROMOLECULES

(75) Inventors: Nobuo Niimura, Ibaraki (JP); Yuki Onishi, Ibaraki (JP); Shigeki Arai, Ibaraki (JP); Toshiyuki Chatake, Ibaraki (JP); Mitsuru Maeda, Ibaraki (JP); Kazuo Kurihara, Ibaraki (JP)

(73) Assignee: Japan Atomic Energy Research Institute, Kashiwa (JP)

( * ) Notice: Subject to any disclaimer, the term of this patent is extended or adjusted under 35 U.S.C. 154(b) by 10 days.

(21) Appl. No.: 11/471,545

(22) Filed: Jun. 21, 2006

(65) Prior Publication Data

US 2006/0236924 A1    Oct. 26, 2006

Related U.S. Application Data

(63) Continuation of application No. 10/465,576, filed on Jun. 20, 2003.

(30) Foreign Application Priority Data

Jun. 21, 2002    (JP)    ............................... 2002-181988

(51) Int. Cl.
   *C30B 29/58*    (2006.01)
(52) U.S. Cl. .............................. 117/68; 117/69; 117/70; 117/200; 117/203; 117/929
(58) Field of Classification Search .................. 117/68, 117/69, 70, 200, 203, 927
   See application file for complete search history.

(56) References Cited

U.S. PATENT DOCUMENTS

| 6,596,081 | B1 | 7/2003 | Arnowitz et al. |
| 2002/0145231 | A1 | 10/2002 | Quake et al. |
| 2003/0006187 | A1 | 1/2003 | Frey |
| 2003/0049642 | A1 | 3/2003 | Nilsson et al. |
| 2003/0232967 | A1 | 12/2003 | Chait et al. |
| 2004/0219224 | A1 | 11/2004 | Yakovlevsky et al. |
| 2005/0019794 | A1 | 1/2005 | Nassef et al. |

FOREIGN PATENT DOCUMENTS

WO    WO 01/92293 A2    12/2001

OTHER PUBLICATIONS

Peter Wilding, et al. "Micro-microchips: just how small can we go?", *Tibtech*, Dec. 1999 (vol. 17), p. 465-468.
May 4, 2005 Office Action in Parent U.S. Appl. No. 10/465,576, Abandoned.
Dec. 22, 2005 Office Action in Parent U.S. Appl. No. 10/465,576, Abandoned.
May 4, 2006 Advisory Action in Parent U.S. Appl. No. 10/465,576, Abandoned.

*Primary Examiner*—Robert M Kunemund
(74) *Attorney, Agent, or Firm*—Staas & Halsey LLP

(57) ABSTRACT

A method comprising the steps of continuously changing the concentrations in solution of a biomacromolecule to be crystallized and a precipitant, thereby constructing a crystal phase diagram containing a solubility curve, searching for optimum conditions of crystallization on the basis of the constructed crystal phase diagram, and performing efficient growth of the crystal of the biomacromolecule. Also disclosed is an apparatus for implementing the method.

14 Claims, 9 Drawing Sheets

US 7,819,973 B2

APPARATUS FOR CRYSTAL GROWTH OF BIOMACROMOLECULES

This application is a continuation of U.S. application Ser. No. 10/465,576, filed Jun. 20, 2003, the contents of which are incorporated herein by reference. This application is based upon and claims the benefit of priority from Japanese Patent Application No. 2002-181988, filed Jun. 21, 2002, the entire contents of this application are incorporated herein by reference.

BACKGROUND OF THE INVENTION

This invention relates to an apparatus for efficient preparation of the crystals of biomacromolecules such as proteins and nucleic acids. The invention also relates to a method for preparing the crystals of biomacromolecules in which the concentration in solution of a biomacromolecule such as a protein or nucleic acid and the concentration of a precipitant are adjusted on a real-time basis to construct a crystal phase diagram for the biomacromolecule and, in addition, on the basis of the constructed crystal phase diagram, the solution of the biomacromolecule is shifted between a supersaturated and a metastable region to effect nucleation and growth of the biomacromolecule's crystal.

Following the success in mapping of the human genome, an international project has launched with the hope of determining the three-dimensional structures (about 10,000 in number) of the structural families of all proteins in five years. With a view to determining 3,000 out of those 10,000 proteins primarily by x-ray analysis and NMR, Japan has started the so-called Project 3000 Proteins. It is not clear how many of the 3,000 proteins are going to be determined by x-ray analysis of crystal structures but 2,000 would be a minimum number.

In the x-ray analysis of crystal structures, a single crystal to be subjected to structural analysis is essential and preparing such a single crystal has been a bottleneck in the art.

Vapor diffusion is one of the conventional methods commonly employed to prepare single crystals. In this method, the moisture in a solution that lies in the unsaturated region of a phase diagram for the molecule to be crystallized is vaporized, whereby the concentration of the molecule to be crystallized and that of a precipitant are increased so that the state of the solution is shifted to the supersaturated region in the phase diagram, thereby starting the growth of a crystal and causing it to grow. In this method of crystal growth, the concentration of the molecule to be crystallized and that of the precipitant are not controlled artificially, so in order to prepare a single crystal of a certain molecule to be subjected to structural analysis, it has been necessary to prepare solutions of the molecule under a huge number of conditions and cause it to crystallize out of the individual solutions.

In addition, as the solvent vaporizes, the concentration of the molecule to be crystallized and that of the precipitant will only change to increase, so once the solution is shifted into the unsaturated region with a view to forming crystal nuclei, it is difficult to readjust the conditions of the solution to enter the metastable region which provides more preferred conditions for crystal growth.

On account of these problems, single crystal preparation by the vapor diffusion method has been considerably wasteful both time-wise and money-wise.

In order to solve the above-mentioned problems with the vapor diffusion method, a robot-assisted method for high-throughput crystal growth has been devised (WO 01/92293; Wilding, P. and Kricka, L. J., TIBTECH, 17, 465-468 (1999)).

However, this is no more than a proposal for handling protein solutions by a machine, rather than humans, in the vapor diffusion method and it by no means provides a new technique for crystal growth. As a matter of fact, the problems with the vapor diffusion method are yet to be solved by the proposal.

Even today, the essence of structural biology lies in unraveling the physiological functions of a certain molecule at the atomic level by determining the hydrogen atoms and structure of hydration through high-resolution structural analysis and neutron diffractometry, both being intended to attain a resolution in the neighborhood of 1 angstrom. To meet this need, single crystals are required that are either of good quality or larger than 1 $mm^3$.

Single crystals that satisfy these requirements are difficult to obtain by just repeating the conventional mechanical trial-and-error approach and it is strongly desired to develop a method and an apparatus that facilitate the production of biomacromolecules as single crystals having the required level of quality.

SUMMARY OF THE INVENTION

An object, therefore, of the present invention is to provide an apparatus for efficient preparation of single-crystal biomacromolecules.

Another object of the invention is to provide a method for efficient preparation of single-crystal biomacromolecules.

The present inventors have undertaken intensive efforts to develop a reasonable technique for crystal growth. As a result, they discovered a method comprising the steps of continuously changing the concentrations in solution of a biomacromolecule to be crystallized and a precipitant, thereby constructing a crystal phase diagram containing a solubility curve, searching for optimum conditions of crystallization on the basis of the constructed crystal phase diagram, and performing efficient growth of the crystal of the biomacromolecule.

The inventors also constructed an apparatus capable of implementing the method. The present invention has been accomplished on the basis of these findings.

More specifically, the present invention provides an apparatus for the crystal growth of biomacromolecules which crystallizes a biomacromolecule with a precipitant to yield the crystal of the biomacromolecule, comprising:

(i) a first compartment for accommodating a first fluid containing a biomacromolecule to be crystallized;

(ii) a second compartment for accommodating a second fluid containing a precipitant;

(iii) a concentration adjusting means for adjusting the concentration of the biomacromolecule in said first fluid and the concentration of the precipitant in said second fluid; and (iv) a detection means for continuously detecting the crystal growth of said biomacromolecule in the first fluid in said first compartment.

Whenever the term "crystal growth apparatus" appears on the following pages, it shall mean the apparatus for the crystal growth of biomacromolecules.

The crystal growth apparatus of the invention which has the structural design shown above fills the first compartment with the first fluid containing the biomacromolecule to be crystallized and achieves efficient growth of its crystal while continuously monitoring the formation and growth of that crystal in the first fluid.

The crystal growth apparatus of the invention may be so designed that the concentration adjusting means has a dialysis means that is provided at the boundary between the first and second compartments and which establishes solution communication between the first and second fluids.

The dialysis means is preferably formed of a semipermeable membrane that is not permeable to the biomacromolecule in the first fluid but is permeable to the precipitant in the second fluid and the solvent used in the first and second fluids.

Suitable semipermeable membranes are those which are capable of differentiating the biomacromolecule from the precipitant and solvent by an appropriate index such as molecular weight and specific examples are Microcon (Millipore Corporation, MA, USA) and Molecular/Por (Spectrum Laboratories, CA, USA).

In the present invention, it is preferred to differentiate the biomacromolecule from the precipitant and solvent by molecular weight. The pore size of the semipermeable membrane used to differentiate the biomacromolecule from the precipitant and solvent by molecular weight can be easily determined by the skilled artisan on the basis of the relationship between the molecular weight of the biomacromolecule to be crystallized and that of the precipitant.

Since the concentration adjusting means has the dialysis means of the nature described above, the biomacromolecule in the first fluid does not diffuse into the second fluid whereas the precipitant in the second fluid can freely diffuse into the first fluid and then back to the second fluid and the solvent in the first and second fluids is also free to diffuse between the first and second fluids. Thus, by changing the amount of the solvent in the first fluid, the concentration of the biomacromolecule in the first fluid can be adjusted appropriately while, at the same time, the concentration of the precipitant in the second fluid can be changed by causing it to migrate into the first fluid or by causing mutual movements of the solvent in the first and second fluids.

It is also preferred in the present invention that the first and second fluids establish communication only through the dialysis means provided at the boundary between the first and second compartments and that no communication of solutions is established through any other means. The term "solution" as used herein means a liquid having a solute dissolved in a solvent and if a precipitate has occurred in a solution, only the part that is left after removing the precipitate is regarded as "solution".

Because of the above-described characteristics of the dialysis means, if a higher pressure is exerted on the first fluid, the solvent and precipitant in the first fluid diffuse into the second fluid and the volume of the first fluid decreases, whereupon it has a higher concentration of the biomacromolecule. Conversely, if a lower pressure is exerted on the first fluid, the solvent and precipitant in the second fluid flow into the first fluid and the volume of the first fluid increases, whereupon it has a lower concentration of the biomacromolecule.

Therefore, in the present invention, the concentration adjusting means preferably has a pressure adjusting means in the first compartment in order to adjust the pressure on the first fluid and change its volume, thereby adjusting the concentration of the biomacromolecule in it. In this way, the concentration of the biomacromolecule in the first fluid can be changed to a desired value. Examples of the pressure adjusting means include but are not limited to a syringe and bellows that are movable to perform pressure control. In the invention, it is preferred to use a syringe that is movable to perform pressure control.

If the concentration of the precipitant in the second fluid is increased, the concentration of the precipitant in the first fluid can be increased accordingly and if the concentration of the precipitant in the second fluid is decreased, the concentration of the precipitant in the first fluid can be decreased accordingly.

Therefore, in the present invention, the concentration adjusting means preferably has a precipitant feed/discharge means on the second compartment by which the precipitant is fed into and discharged from the second compartment in order to adjust its concentration in the second fluid. As a result, the dialysis means provided at the boundary between the first and second fluids enables the precipitant to be fed into or discharged from the first fluid. The precipitant feed/discharge means may be of any type that can replace the second fluid in the second compartment by a solution of either a higher or a lower concentration of the precipitant. A suitable example is one or more pumps that are capable of adding a solution to the second fluid or removing a solution from it. In the present invention, it is preferred to use one or more pumps that are capable of adding a solution to the second fluid or removing a solution from it. Specifically, feed pumps for use in liquid chromatography are suitable.

Thus, in the present invention, using the above-described concentration adjusting means, one can selectively adjust either the concentration of the biomacromolecule in the first fluid or the concentration of the precipitant in the first and second fluids. Alternatively, the concentration of the biomacromolecule in the first fluid and that of the precipitant in the first and second fluids may be adjusted simultaneously but independently of each other.

The term "the first and second fluids" as used in the invention refers conveniently to the fluids contained in the first and second compartments, respectively. While both fluids are variable in composition during crystal growth, we describe below the compositions of the first and second fluids in the initial state.

The first fluid in the initial state has the solvent and the biomacromolecule as main ingredients, with other additives being optionally contained as required. The concentration of the biomacromolecule to be crystallized is chosen as appropriate for its specific type.

The second fluid in the initial state has the solvent and the precipitant as main ingredients, with other additives being optionally contained as required. The precipitant is chosen by the skilled artisan as appropriate for the type of the biomacromolecule to be crystallized and its concentration may be altered as appropriate for its specific type.

The biomacromolecule to be crystallized in the invention encompasses proteins and nucleic acids but other substances are also included if they are biomacromolecules that are intended to be crystallized.

If nucleic acids are to be crystallized, a variety of precipitants may be employed, including inorganic salts such as ammonium sulfate (($NH_4$)$_2SO_4$), potassium phosphate ($K_3PO_4$), sodium phosphate ($Na_3PO_4$), calcium chloride ($CaCl_2$), magnesium chloride ($MgCl_2$), sodium chloride (NaCl), potassium chloride (KCl) and nickel chloride ($NiCl_2$), organic solvents such as 2-methyl-2,4-pentanediol (MPD), acetone, ethanol, methanol, isopropanol, dioxane and butanol, and poly(ethylene glycol). If proteins are to be crystallized, a variety of precipitants may also be employed and they include but are not limited to ammonium sulfate (($NH_4$)$_2SO_4$) and sodium chloride (NaCl).

The solvent used in the first fluid is the same as the solvent in the second fluid. Water may be mentioned as a specific example.

The detection means in the crystal growth apparatus of the invention is for continuously monitoring the growth of the crystal of the biomacromolecule in the first fluid. When the term "continuously" is used in the invention, it is not necessarily required that monitoring be performed at all times and it may be performed at regular intervals, preferably no longer than one day, more preferably no longer than 12 hours, and most preferably no longer than 1 hour.

The detection means as a component of the crystal growth apparatus of the invention is preferably a visual detection means and has a light transmitting window provided on the first compartment such that light passes through the first compartment to enable visual detection of the crystal growth in it. The detection means is not limited to a visual type and may be a spectroscopic detection means such as one relying on dynamic light scattering.

Crystals often become transparent when they are in solution and a simple attempt at visually monitoring the transmitted light often fails to detect its entity fully. The crystal in solution can be monitored as a phase difference image by using a polarizing filter. Therefore, if the detection means is a visual type, a polarizing filter is preferably provided on the optical path to the light transmitting window.

In another preferred embodiment, the detection means has a light source and a detection unit for detecting the light issued from the light source, the polarizing filter comprises a first polarizing filter element that polarizes the light from the light source before it illuminates the light transmitting window and a second polarizing filter element that polarizes the light from the light source after it passes through the light transmitting window to travel to the outside of the first compartment, said detection means being so constructed that it detects the light from the light source after it has passed through the first polarizing filter element to be launched into the light transmitting window on the first compartment, through which it passes to emerge from the light transmitting window and then passes through the second polarizing filter element.

Examples of the detection unit that may be used by the detection means of the invention for the purpose of visually monitoring the crystal growth of the biomacromolecule include recording devices such as a camera and video recorder and observing devices such as an optical microscope. Considering preferred conditions such as capability for continuous monitoring and ease of recording, recording devices such as a camera and a video recorder that use a CCD or observing devices such as an optical microscope are preferably used as the detection unit in the invention.

The crystal growth apparatus of the invention may further comprise a system temperature control means for maintaining the temperatures of the first and second fluids at desired levels so that the conditions for crystal growth are held constant. In this case, the temperatures of the first and second fluids are preferably maintained at 4-30° C., more preferably at 6-22° C., and most preferably at 18-20° C.

We next describe the method of producing the crystal of a biomacromolecule.

According to the second aspect of the invention, there is provided a method of producing the crystal of a biomacromolecule using the above-described apparatus for the crystal growth of biomacromolecules. The method comprises the steps of detecting the crystal growth of a biomacromolecule over time by the aforementioned detection means to determine the correlation between the concentration of a precipitant, the concentration of the biomacromolecule and the grown crystal of the biomacromolecule, representing the determined correlation in graphic form to construct a basic crystal phase diagram, and growing the crystal of the biomacromolecule under optimum crystallizing conditions on the basis of the constructed crystal phase diagram.

The term "phase diagram" as used herein refers to a diagram showing a range in which a supersaturated and a undersaturated region in a two-phase system are in thermodynamic equilibrium and in which a supresaturated region and a unsaturated region are divided by a solubility curve. Phase stable regions in phase diagrams are generally expressed as a function of two variables chosen from among temperature, concentration, pressure, etc. In the case of the present invention, the concentration of the biomacromolecule to be crystallized and that of the precipitant are two such variables.

In a phase diagram for a two-phase system of the type contemplated in the present invention which consists of a supersaturated and a undersaturated region, the supersaturated region and the undersaturated region which are separated by the solubility curve are not the only regions that exist and the supersaturated region consisted of two specific regions, a "supersaturated region" in a narrow definition (hereinafter referred to as "supersaturated region") where crystal nuclei are formed and crystals can grow and a "metastable region" where crystals grow but crystal nuclei are not formed. In the "supersaturated region", crystal nuclei are formed one after another, so if this region is maintained too long, the number of crystal grains formed will inevitably increase and their size decreases. On the other hand, if a desired number of crystal nuclei are first formed in the "supersaturated region" and then a shift is made to the "metastable region", the number of crystal grains can be controlled to a desired value and they still have a desired size.

If the method of the invention is performed using the crystal growth apparatus of the invention, the concentration of the biomacromolecule to be crystallized and that of the precipitant can be controlled freely and independently of each other and it is free to create a "supersaturated region" or a "metastable region" within the first compartment. In order to know the conditions under which a phase shift occurs, it has heretofore been necessary to conduct a large number of experiments under various conditions and find the conditions that allow for actual formation of crystals. According to the present invention, one only need perform a single crystallization to draw a solubility curve and construct a phase diagram while simultaneously determining the "supersaturated region" and the "metastable region". In other words, the apparatus of the invention for crystal growth of biomacromolecules is capable of not only causing crystal grains to grow but also constructing a crystal phase diagram.

As described above, according to the invention, the concentration of the biomacromolecule to be crystallized and that of the precipitant can be controlled freely and independently of each other. Therefore, the object of the invention can also be attained by a method in which the crystal of a biomacromolecule to be crystallized is grown under optimum conditions by continuously changing the concentration of the biomacromolecule and that of a precipitant, said method comprising the steps of:

(a) increasing the concentration of the biomacromolecule and/or the concentration of the precipitant so that the solution containing said biomacromolecule is shifted to the supersaturated region of a phase diagram for that biomacromolecule, thereby causing it to form crystal nuclei; and (b) thereafter adjusting the concentration of the biomacromolecule and/or that of the precipitant such that the solution containing said biomacromolecule is shifted to the metastable region of the phase diagram for that biomacromolecule, thereby growing the crystal nuclei formed in step (a).

The term "adjusting the concentration" refers to both increasing and decreasing the concentration. Therefore, in step (b), the concentrations of the biomacromolecule and the precipitant may both be increased or decreased depending on the case, freely and independently of each other. By performing steps (a) and (b) in appropriate ways, a desired number of crystal nuclei are formed in the supersaturated region and then a shift is made to the metastable region so that the number of crystal grains are controlled to a desired value while adjusting them to a desired size.

In an embodiment of the invention, step (c) of choosing only one crystal nucleus may be included between steps (a) and (b).

In step (a), more than one crystal nucleus may be formed in the solution after it is shifted to the supersaturated region. In this case, by choosing the single largest nucleus, more efficient crystal growth can be realized and, in addition, the biomacromolecule present in a limited amount in the sample can be intensively used to grow a single crystal.

In the invention, various methods can be employed to choose only one of the crystal nuclei formed in the solution. In one method, the concentration of the biomacromolecule and/or that of the precipitant is adjusted such that the solution is shifted to the unsaturated region and crystal nuclei are dissolved until only one crystal nucleus remains in the solution. In another method, only one crystal nucleus is left physically intact and all other crystal nuclei are removed. In yet another method, only one crystal nucleus is isolated from other crystal nuclei. In the invention, it is preferred to adopt the method of adjusting the concentration of the biomacromolecule and/or that of the precipitant such that the solution is shifted to the unsaturated region and crystal nuclei are dissolved until only one crystal nucleus remains in the solution. In this method, the largest of the crystal nuclei that are present in the solution will usually remain undissolved and the solution containing only such residual crystal nuclei may be re-shifted into the metastable region for starting another cycle of crystal growth.

DETAILED DESCRIPTION OF THE INVENTION

One preferred embodiment of the invention is hereunder described with reference to the accompanying drawings but it should be understood that the invention is by no means limited to that particular embodiment.

Figure 1:
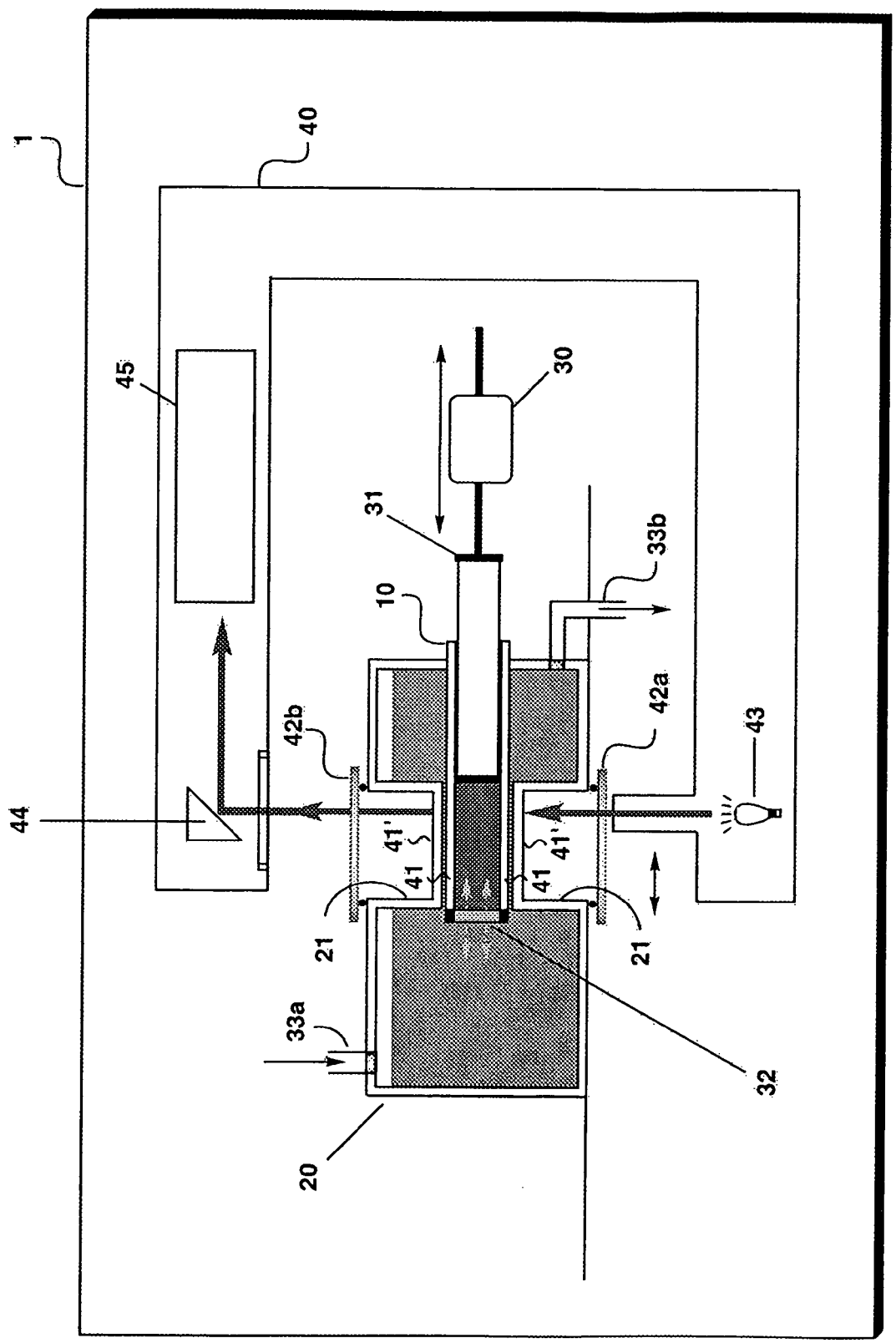
FIG. 1 is a schematic diagram showing a preferred embodiment of the present invention as it relates to an apparatus for crystal growth of biomacromolecules.

FIG. 1 is a schematic diagram showing a preferred embodiment of the invention as it relates to an apparatus for crystal growth of biomacromolecules. The apparatus generally indicated by 1 in FIG. 1 is for crystallizing a biomacromolecule with a precipitant and causing the crystal to grow. It comprises a first compartment 10 for a first fluid containing the biomacromolecule to be crystallized, a second compartment 20 for a second fluid containing the precipitant, a concentration adjusting means 30 for adjusting the concentration of the biomacromolecule in the first fluid and that of the precipitant in the second fluid, and a detection means 40 for continuously detecting the crystal growth of the biomacromolecule in the first fluid in the first compartment.

To describe further, the concentration adjusting means 30 has a dialysis membrane 32 as a dialysis means that is provided at the boundary between the first compartment 10 and the second compartment 20 to establish solution communication between the first and second fluids. In the embodiment under consideration, the dialysis membrane 32 is a semipermeable membrane having the characteristics already described above.

The first compartment 10 is in cylindrical form and has the dialysis membrane 32 at an end. The first compartment 10 has at the other end a syringe 31 that is part of the concentration adjusting means 30 and which pressurizes or evacuates the interior of the first compartment 10 so that the solvent in the first fluid in it is diffused into the second compartment 20 or is drawn back into the first compartment 10. Structural details of the syringe 31 are not shown but it fits the inner surfaces of the first compartment 10 so tightly that the first fluid will not leak out.

The second compartment 20 is a hollow cylinder having a constriction 21 in the center to be generally shaped like "H" in cross-sectional form. It has a feed inlet 33a at the front end and a discharge outlet 33b at the rear end. The solvent and precipitant that are ingredients in the second fluid are fed into the second compartment via the inlet 33a and discharged from the second compartment via the outlet 33b. The feed inlet 33a and the discharge outlet 33b are other components of the concentration adjusting means 30. Thus, in the embodiment under consideration, the concentration adjusting means 30 consists of the syringe 31, dialysis membrane 32, feed inlet 33a and discharge outlet 33b. The constriction 21 in the second compartment 20 has a slightly larger inside diameter than the outside diameter of the first compartment 10.

The detection means 40 is a visual type and has a light transmitting window 41 provided on the first compartment 10 in such a way that light passes through the first compartment 10 to enable visual detection of crystal growth in it. In the embodiment under consideration, the peripheral wall of the first compartment 10 is thoroughly formed of a light transmitting material, specifically, clear quartz glass, so that the first compartment 10 is enclosed with the light transmitting window 41 throughout. The constriction 21 of the second compartment 20 is also formed of a light transmitting material, specifically, clear quartz glass. Hence, the second compartment 20 is also fitted with a light transmitting window 41'.

In the embodiment under consideration, the detection means 40 has a polarizing filter on the optical path to the light transmitting windows 41 and 41'. It also has a light source 43 and a detection unit 45 for detecting the light issued from the light source 43, and the polarizing filter comprises a first polarizing filter element 42a that polarizes the light from the light source 43 before it illuminates the light transmitting windows 41 and 41' and a second polarizing filter element 42b that polarizes the light from the light source 43 after it passes through the light transmitting windows 41 and 41' to travel to the outside of the first compartment 10. The detection means 40 is so constructed that it detects the light from the light source 43 after it has passed through the first polarizing filter element 42a to be launched into the light transmitting window 41 on the first compartment 10, through which it passes to emerge from the light transmitting window 41 and then passes through the second polarizing filter element 42b. In the embodiment under consideration, the first and second polarizing filter elements 42a and 42b are both provided on the outer surfaces of the second compartment 20.

In the embodiment under consideration, a mirror 44 is provided so that the light passing through the second polarizing filter element 42b is guided into a CCD camera as the detection unit 45.

In the embodiment under consideration, a heater and an insulation jacket are provided (not shown) as the system temperature control means. In the embodiment under consideration, the temperatures of the first and second fluids are controlled at 6-22° C. by such temperature control means.

Using the above-described apparatus for the crystal growth of biomacromolecules, the invention detects the crystal growth of a biomacromolecule over time by the aforementioned detection means to determine the correlation between the concentration of a precipitant, the concentration of the biomacromolecule and the grown crystal of the biomacromolecule, represents the determined correlation in graphic form to construct a basic crystal phase diagram, and grows the crystal of the biomacromolecule under optimum crystallizing conditions on the basis of the constructed crystal phase diagram.

In this method, the biomacromolecule's crystals of a desired size can be efficiently obtained by (a) increasing the concentration of the biomacromolecule and/or the concentration of the precipitant so that the solution containing the biomacromolecule is shifted to the supersaturated region of a phase diagram for that biomacromolecule, thereby causing it to form crystal nuclei and (b) thereafter adjusting the concentration of the biomacromolecule and/or the concentration of the precipitant so that the solution containing the biomacromolecule is shifted to the metastable region of the phase diagram for that biomacromolecule, thereby growing the crystal nuclei formed in step (a).

The present invention is by no means limited to the foregoing embodiment and various improvements and modifications can be made without departing from the spirit and scope of the invention.

For example, two cylindrical vessels having the same diameter may be connected with a semipermeable membrane interposed in such a way as to prevent the leakage of the internal fluids. One of the two cylindrical vessels is used as the first compartment and the other used as the second compartment. After being filled with the first fluid, the first compartment is fitted with the syringe described above; on the other hand, the second compartment is provided with the feed inlet and the discharge outlet and then filled with the second fluid. In this case, the visual detection means has the same construction as the one described in the foregoing embodiment, except that a light transmitting window is provided on the first compartment but not on the second compartment.

The following examples are provided for the purpose of further illustrating the present invention but are in no way to be taken as limiting.

EXAMPLE 1

Changing the Concentration of Precipitant and Crystal Formation

Hen egg lysozyme (59.0 mg/mL) in a buffer solution (50 mM sodium acetate/acetic acid, pH 4.7) was used as a biomacromolecule to be crystallized. Using sodium chloride in a buffer solution (50 mM sodium acetate/acetic acid, pH 4.7) as a precipitant, the hen egg lysozyme was crystallized in a thermostatic incubator at 22.degree. C. Spectra/Por MWCO=3500 (Spectrum Laboratories, CA, USA) was used as a dialysis membrane. A 10 µL micro-dialysis button (Hampton Research, CA, USA) was used as the first compartment and a 50 µL screw vial was used as the second compartment.

Figure 2:
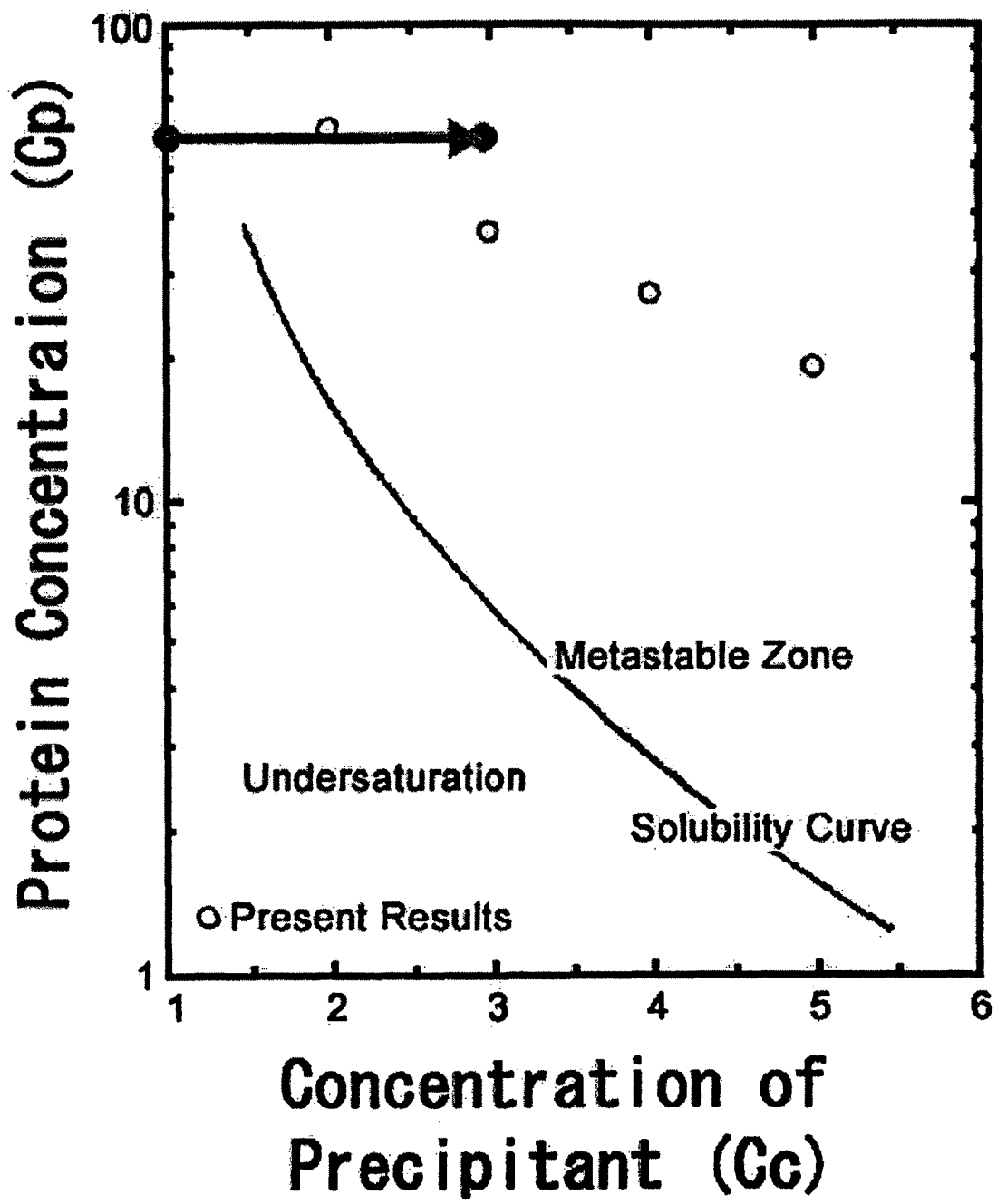
FIG. 2 is a phase diagram showing how a solution containing hen egg lysozyme turned out when the concentration of sodium chloride was increased from 1% to 3%, with the concentration of hen egg lysozyme kept constant.
Figure 3:
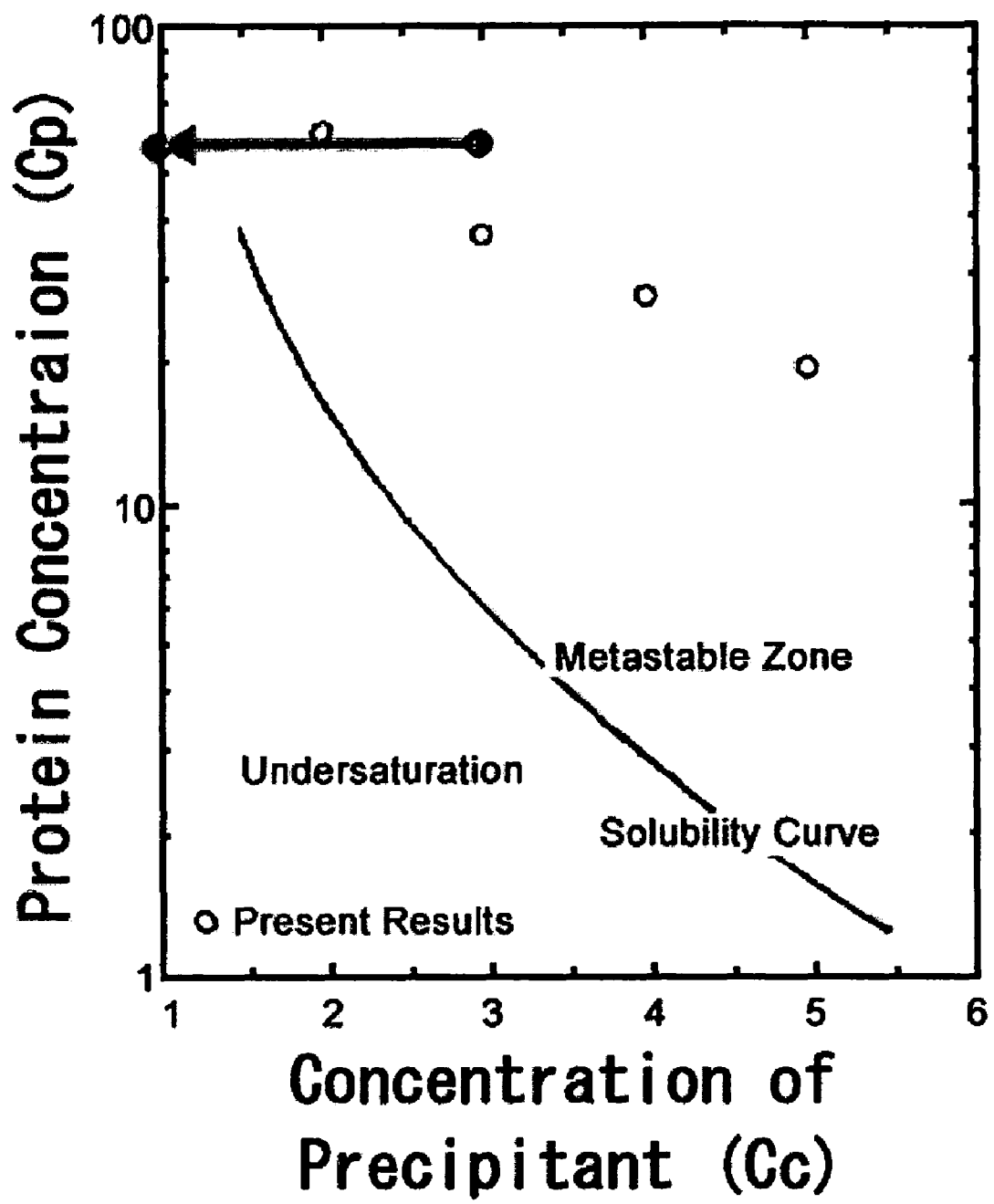
FIG. 3 is a phase diagram showing how a solution containing hen egg lysozyme turned out when the concentration of sodium chloride was decreased from 3% to 1%, with the concentration of hen egg lysozyme kept constant.

In this example, the reaction system was left to stand for 26 hours with the concentration of hen egg lysozyme in the buffer solution being kept constant but the concentration of sodium chloride increased from the initial 0% to 1%. Then, the concentration of sodium chloride as the precipitant was further increased to 3% and the reaction system was left to stand for 19 hours. Thereafter, the concentration of sodium chloride was reverted to 1% and the reaction system was left to stand for 20 hours. The changes in the concentration of sodium chloride are depicted in the phase diagrams in FIGS. 2 and 3. The temperatures of the first and second fluids were controlled with an incubator (MIR153 of Sanyo Electric Co., Ltd.)

Figure 4:
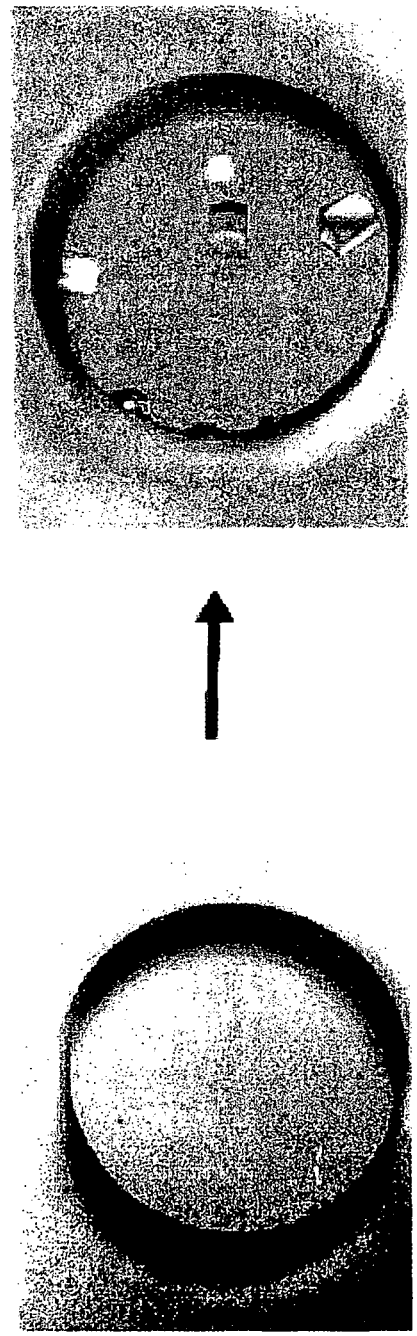
FIG. 4 shows by two micrographs the formation of single-crystal grains of hen egg lysozyme in solution as the concentration of sodium chloride was increased from 1% (left picture) to 3% (right picture), with the concentration of hen egg lysozyme kept constant.
Figure 5:
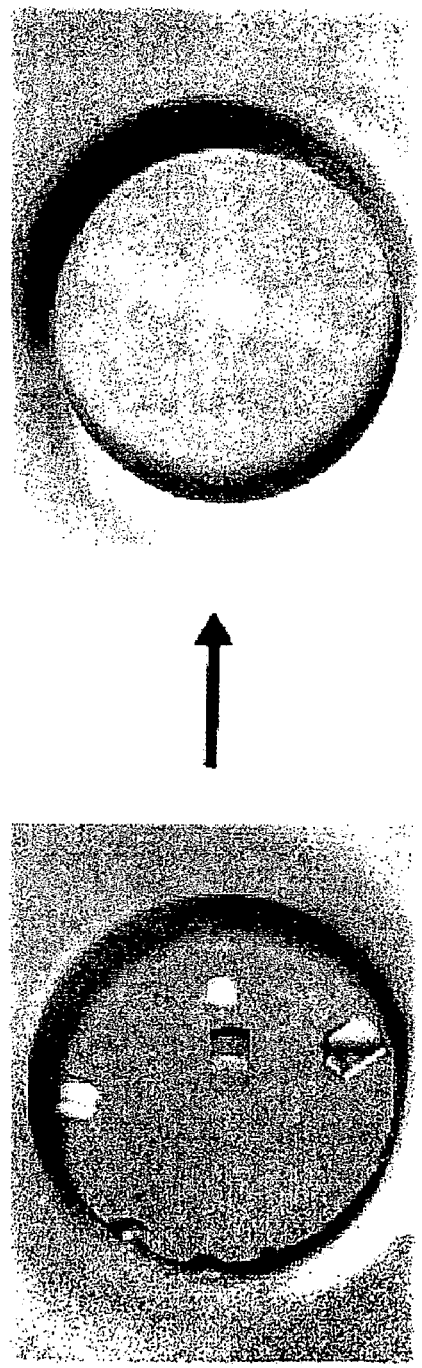
FIG. 5 shows by two micrographs the redissolution of single-crystal grains of hen egg lysozyme as the concentration of sodium chloride was decreased from 3% (left picture) to 1% (right picture), with the concentration of hen egg lysozyme kept constant.

With the concentration of sodium chloride being varied, the state of crystallization of the hen egg lysozyme in solution was observed with a microscope (SZX of OLYMPUS OPTICAL CO., LTD., Tokyo), a CCD camera (KP-C251 of Hitachi Electronics Co., Ltd.) and a computer (Macintosh Power PC 7600 of Apple Computer Inc., CA, USA). As it turned out, crystals formed with increasing concentration of the precipitant (FIG. 4) and they dissolved again into solution with decreasing concentration of the precipitant (FIG. 5).

EXAMPLE 2

Changing the Concentrations of Precipitant and Biomacromolecule and Crystal Formation In this example, hen egg lysozyme was crystallized under the same conditions as in Example 1, except that the concentrations of hen egg lysozyme as biomacromolecule and sodium chloride as precipitant were changed continuously under different conditions.

Figure 6:
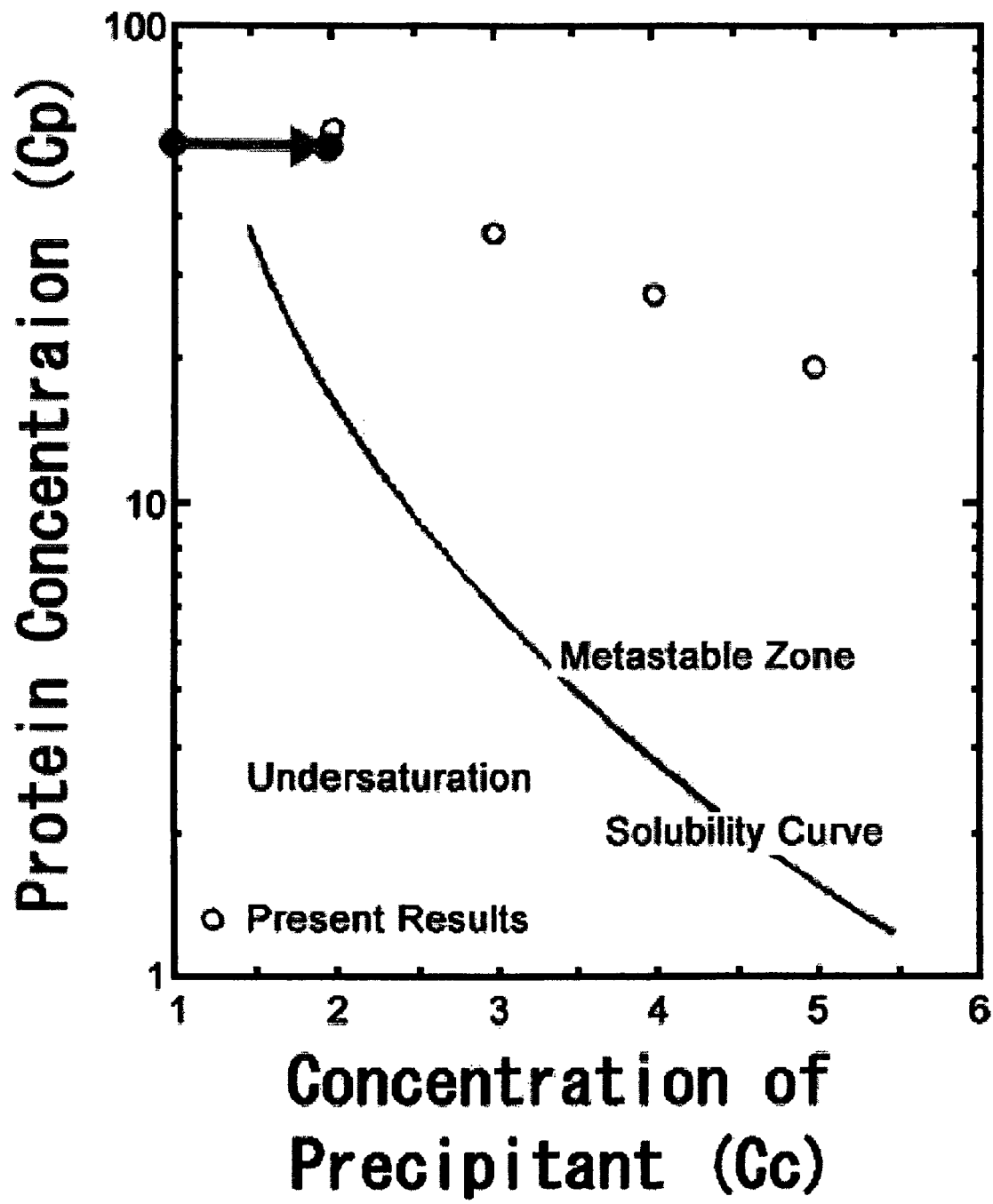
FIG. 6 is a phase diagram showing how a solution containing hen egg lysozyme turned out when the concentration of sodium chloride was increased from 1% to 2%, with the concentration of hen egg lysozyme kept constant.
Figure 7:
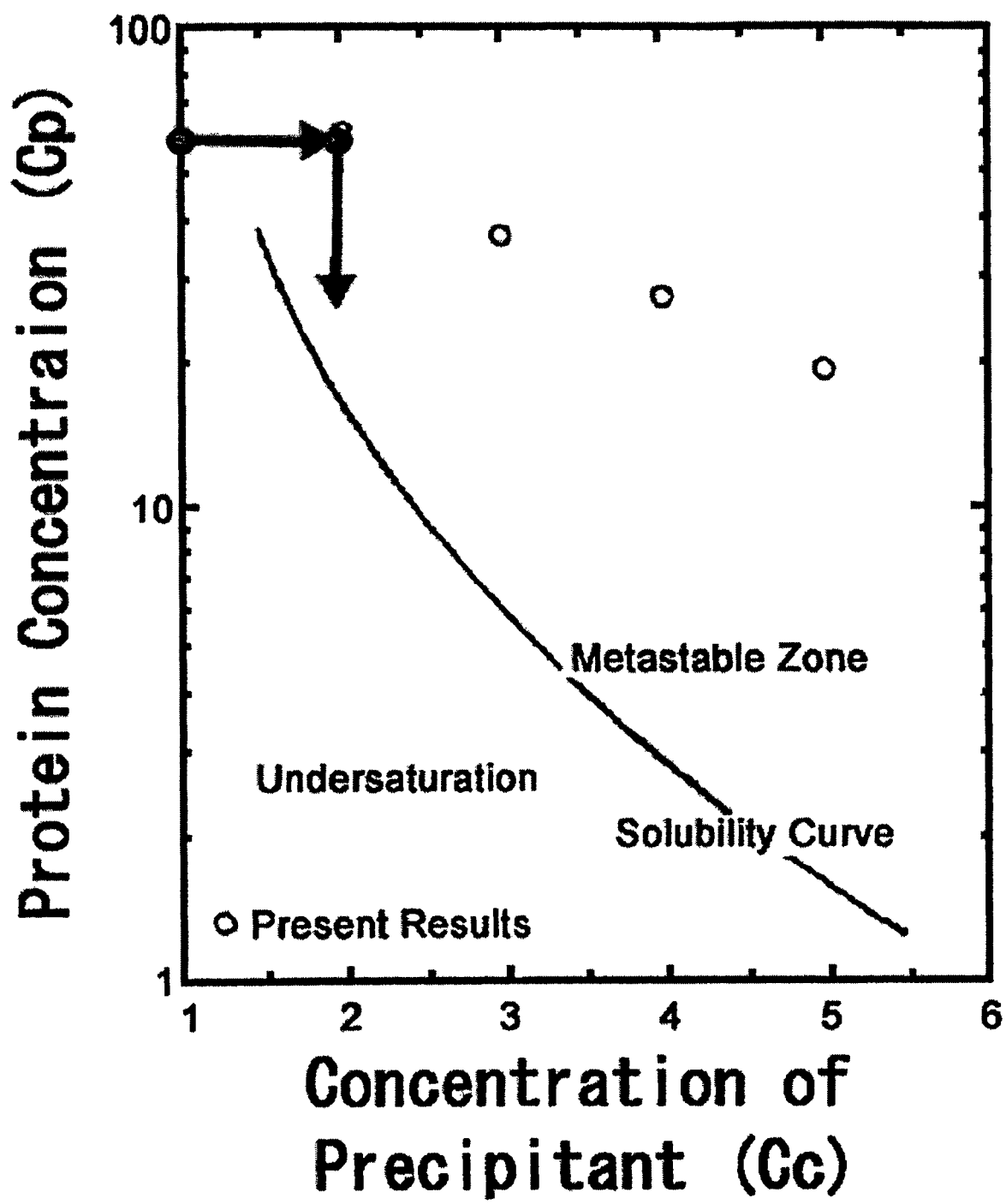
FIG. 7 is a phase diagram showing how a solution containing hen egg lysozyme turned out when the concentration of hen egg lysozyme was decreased from 59.0 mg/mL to 17.2 mg/mL, with the concentration of sodium chloride maintained at 2%.

First, the reaction system was left to stand for 7 days with the concentration of hen egg lysozyme being held constant but the concentration of sodium chloride adjusted to the initial 1%. Thereafter, the concentration of sodium chloride as the precipitant was increased to 2%. Then, the concentration of sodium chloride in solution was maintained at a constant level of 2%. The concentration of hen egg lysozyme decreased from the initial 59.0 mg/mL to 17.2 mg/mL over 16 days. The changes in the concentrations of sodium chloride and hen egg lysozyme are depicted in the phase diagrams in FIGS. 6 and 7, respectively.

Figure 8:
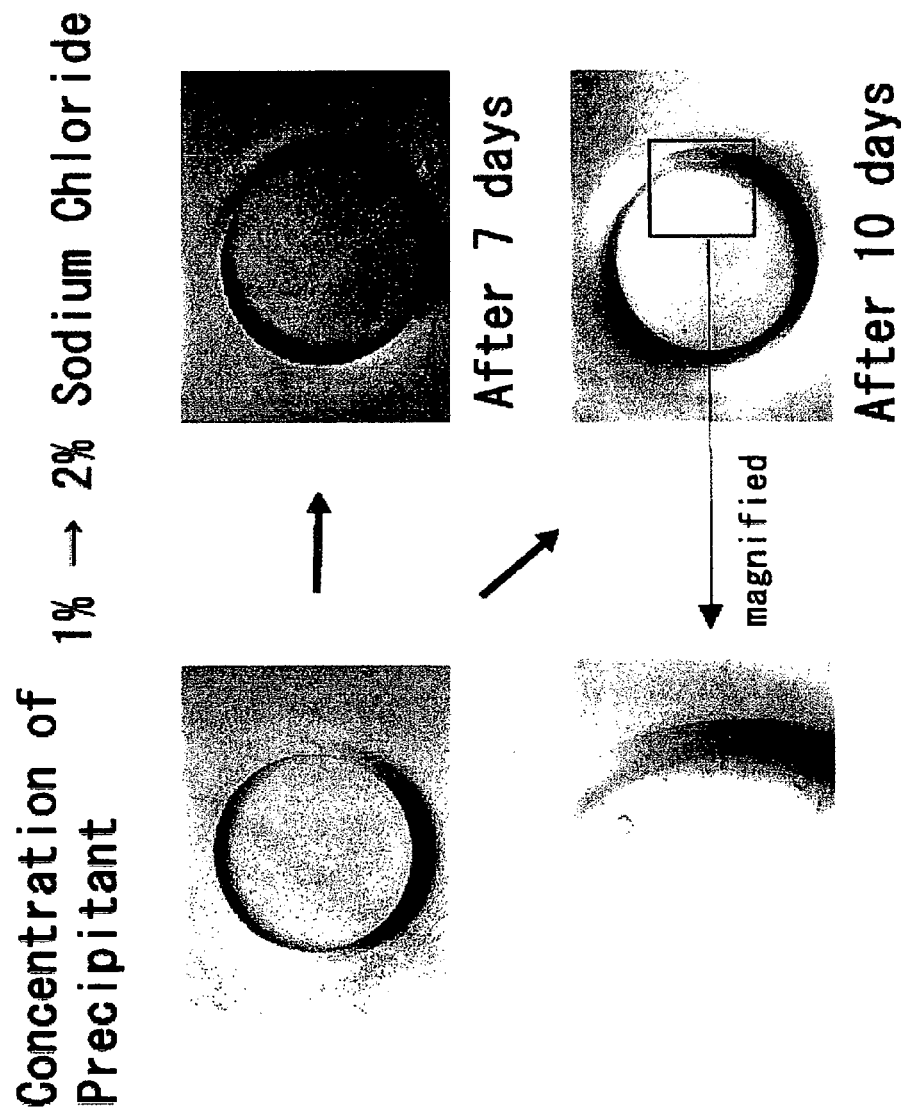
FIG. 8 shows by four micrographs the formation of single-crystal grains of hen egg lysozyme in solution as the concentration of sodium chloride was increased from 1% (top left picture) to 2% (bottom right picture), with the concentration of hen egg lysozyme kept constant.
Figure 9:
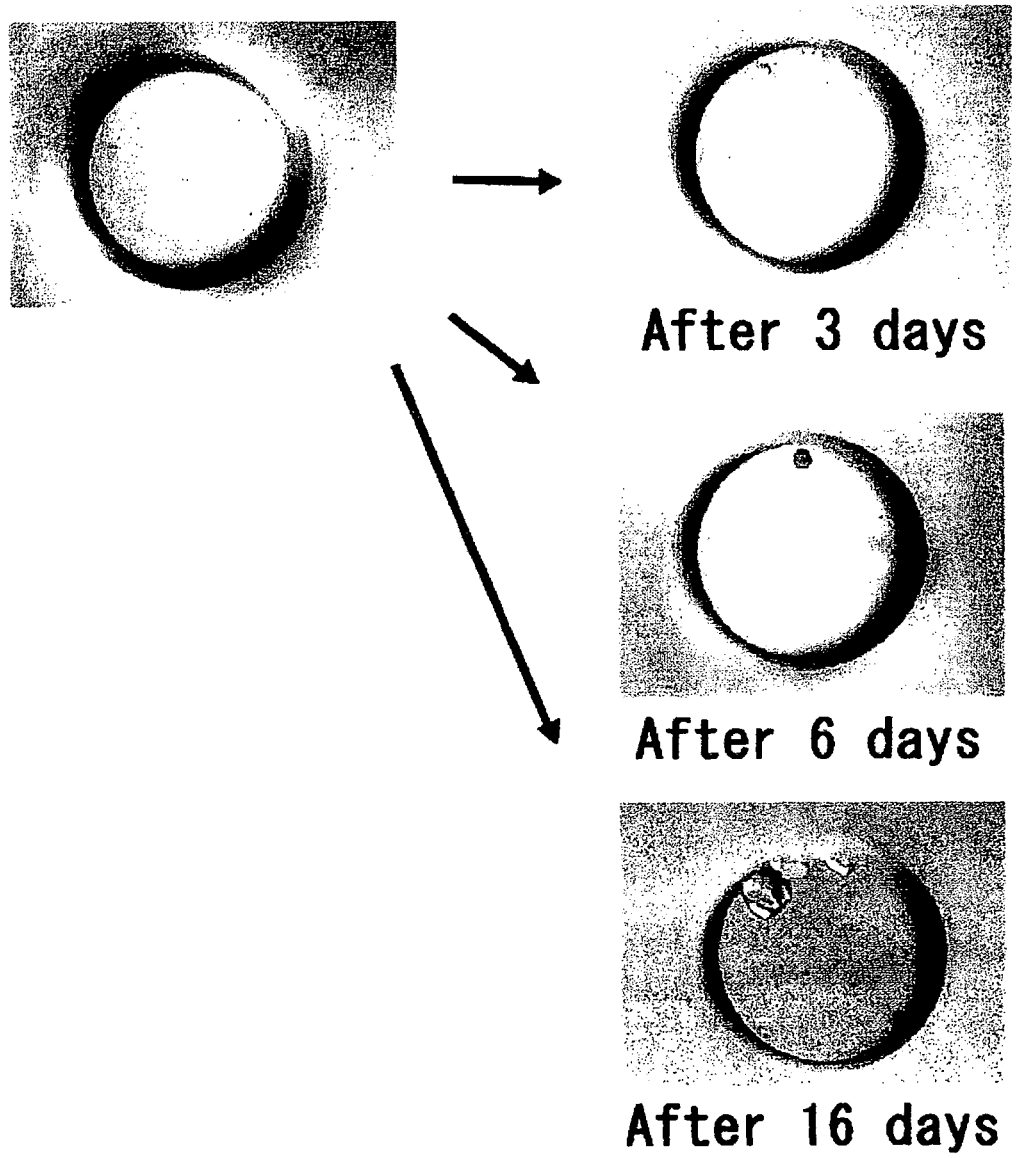
FIG. 9 shows by four micrographs the growth of crystals of hen egg lysozyme in solution as the concentration of hen egg lysozyme was decreased from 59.0 mg/mL (top left picture) to 17.2 mg/mL (bottom right picture), with the concentration of sodium chloride maintained at 2%.

With the concentration of sodium chloride or hen egg lysozyme being varied as described above, the state of crystallization of hen egg lysozyme in solution was observed using the same devices as those employed in Example 1. As it turned out, crystals formed with increasing concentration of the precipitant (FIG. 8) and the crystal nuclei formed under that condition grew with the lapse of time when the concentration of the biomacromolecule dropped from 59.0 mg/mL to 17.2 mg/mL (FIG. 9).

What is claimed is:

1. An apparatus for crystal growth of biomacromolecules, comprising:
   a first compartment having a volume for accommodating a first fluid containing a solvent and a biomacromolecule to be crystallized,
   a second compartment for accommodating a second fluid containing a solvent and a precipitant;
   a biomacromolecule concentration adjuster, a first portion of which separates the first and second compartments and is permeable to the solvents and the participant, but not the biomacromolecule, thereby allowing selective fluid communication between the first fluid and the second fluid across the first portion, and a second portion of which is movable within the first compartment between a first position and a second position to exert a pressure on the first fluid,
   wherein, when the second portion is in the first position, a higher pressure is exerted on the first fluid, the solvent and the precipitant in the first fluid diffuse into the second fluid and the volume of the first compartment decreases, whereupon a concentration of the biomacromolecule in the first compartment increases, and when the second portion is in the second position, a lower pressure is exerted on the first fluid, the solvent and the precipitant in the second fluid flow into the first fluid and the volume of the first compartment increases, whereupon the concentration of the biomacromolecule in the first compartment decreases; and
   a detector to detect a crystal growth of the biomacromolecule in the first fluid.

2. The apparatus according to claim 1, wherein the first portion of the adjuster is a semipermeable membrane.

3. The apparatus according to claim 2, wherein the detector is a visual detector having a light transmitting window provided on the first compartment to allow light to pass through the first compartment and allow visual detection of the crystal growth.

4. The apparatus according to claim 3, wherein said visual detector has a polarizing filter in an optical path to said light transmitting window.

5. The apparatus according to claim 4, wherein said detector has a light source and a unit for detecting the light from the light source, a filter device with a first filter that polarizes the light from the light source before the light illuminates the light transmitting window, and a second filter that polarizes the light from the light source after the light passes through the light transmitting window to travel out of the first compartment, wherein the detector detects the light from the light source after the light has passed through the first filter to enter the light transmitting window on the first compartment, through which the light passes to emerge from the light transmitting window and then passes through the second filter.

6. The apparatus according to claim 5, wherein said detection unit is an optical microscope, a CCD or a digital camera.

7. The apparatus according to any one of claims 2-6, further comprising a controller to regulate a temperature of the first fluid and a temperature of the second fluid.

8. A method for the crystal growth of biomacromolecules using the apparatus according to claim 1, comprising the steps of:
   detecting a crystal growth of a biomacromolecule over time by the detector to determine a correlation between the concentration of the precipitant, the concentration of the biomacromolecule and a grown crystal of the biomacromolecule;
   representing the determined correlation in graphic form to construct a basic crystal phase diagram; and
   growing the grown crystal of the biomacromolecule based on the constructed crystal phase diagram.

9. A method for crystal growth of biomacromolecules, comprising the steps of:
   providing a first compartment with a first fluid containing a solvent and a biomacromolecule to be crystallized;
   providing a second compartment having a volume for accommodating a second fluid containing a solvent and a precipitant;
   providing a biomacromolecule concentration adjuster, a first portion of which separates the first and second compartments and is permeable to the solvents and the participant, but not the biomacromolecule, thereby allowing selective fluid communication between the first fluid and the second fluid, and a second portion of which is movable within the first compartment between a first position and a second position to exert a pressure on the first fluid;
   moving the second portion within the first compartment to the first position to increase pressure on the first fluid, causing the solvent and the precipitant in the first fluid to diffuse into the second fluid and causing the volume of the first compartment to decrease, whereupon a concentration of the biomacromolecule in the first compartment increases, and
   moving the second portion within the first compartment to the second position to decrease the pressure on the first fluid, causing the solvent and the precipitant in the second fluid to flow into the first fluid and the volume of the first compartment to increase, whereupon the concentration of the biomacromolecule in the first compartment decreases.

10. The method according to claim 9, wherein, (a) when the concentration of the biomacromolecule increases, the first fluid containing the biomacromolecule is shifted to a supersaturated region of a phase diagram for that biomacromolecule, thereby causing the biomacromolecule to form crystal nuclei, and wherein, (b) when the concentration of the biomacromolecule decreases, the first fluid containing the biomacromolecule is shifted to a metastable region of the phase diagram for that biomacromolecule, thereby growing the crystal nuclei.

11. The method according to claim 10, which further includes a step (c) of choosing only one crystal nucleus between steps (a) and (b).

12. The method according to claim 9, further comprising selecting the biomacromolecule to be a protein.

13. The method according to claim 9, further comprising selecting the biomacromolecule to be a nucleic acid.

14. The apparatus according to claim 9, further comprising regulating a temperature of the first fluid and a temperature of the second fluid.

* * * * *